United States Patent
Yang

(10) Patent No.: US 10,515,686 B1
(45) Date of Patent: Dec. 24, 2019

(54) LOW VOLTAGE REFERENCE CURRENT GENERATOR AND MEMORY DEVICE USING SAME

(71) Applicant: MACRONIX INTERNATIONAL CO., LTD., Hsinchu (TW)

(72) Inventor: Shang-Chi Yang, Changhua (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/054,586

(22) Filed: Aug. 3, 2018

(51) Int. Cl.
G11C 5/14 (2006.01)
G11C 11/4099 (2006.01)
G11C 7/14 (2006.01)
G11C 29/02 (2006.01)

(52) U.S. Cl.
CPC ............ *G11C 11/4099* (2013.01); *G11C 7/14* (2013.01); *G11C 29/028* (2013.01); *G11C 5/147* (2013.01)

(58) Field of Classification Search
CPC ....................................................... G11C 5/147
USPC ..................................................... 365/185.21
See application file for complete search history.

(56) References Cited

U.S. PATENT DOCUMENTS

| | | | |
|---|---|---|---|
| 7,724,595 B2 | 5/2010 | Lin et al. | |
| 8,213,234 B2 | 7/2012 | Chen et al. | |
| 9,158,321 B2 | 10/2015 | Ting | |
| 2009/0097323 A1* | 4/2009 | Bode | G11C 5/147 365/185.21 |
| 2011/0216601 A1 | 9/2011 | Liao et al. | |

FOREIGN PATENT DOCUMENTS

| | | |
|---|---|---|
| EP | 1071094 A1 | 1/2001 |
| TW | 201401918 A | 1/2014 |
| WO | 2014/070366 A1 | 5/2014 |

OTHER PUBLICATIONS

EP 18192695.7 Extended Search Report dated Mar. 26, 2019, 8 pages.

* cited by examiner

*Primary Examiner* — Jason Lappas
(74) *Attorney, Agent, or Firm* — Haynes Beffel & Wolfeld LLP

(57) ABSTRACT

A reference current circuit usable in a memory circuit has an input leg comprising a current sink and a first resistor connected between the current sink and a voltage supply node, and has an output leg connected between the supply voltage node and a load. The output leg includes a second resistor and a control transistor. The load is connected in current flow communication with the control transistor. An amplifier has a first input connected to the output node of the current sink in the input leg and a second input connected to the second resistor. An output of the amplifier is connected to the gate of the control transistor.

16 Claims, 3 Drawing Sheets

LOW VOLTAGE REFERENCE CURRENT GENERATOR AND MEMORY DEVICE USING SAME

BACKGROUND

Field

The present invention relates to reference current generators, including reference current generators used in integrated circuit memory devices.

Description of Related Art

Reference current generators are used in a wide variety of circuits. A common circuit technique used in reference current generators includes connecting the reference leg of a current mirror to a current sink, and using the output leg of the current mirror to produce a reference current as a function of the characteristics of the current sink. For example, in memory devices, sense amplifiers have been designed that compare a reference current or voltage generated using a reference current to corresponding output from a selected memory cell to sense stored data. In this example, the current sink in the reference current generator can comprise a circuit that emulates the bit line or the memory cell alone, in the memory.

The current sink and the current mirror reference leg both have minimum operating voltages. Thus, as the supply voltages being used in commercial circuits fall below the sum of these minimum operating voltages, a reference current generator having this architecture will fail to operate. This problem arises particularly as the supply voltages fall below about 1.2 V, and even as low as 1 V or less.

It is desirable therefore to provide a reference current generator operable at low supply voltage levels.

SUMMARY

A reference current circuit is described which is operable at low supply voltages.

An example is described comprising a reference current circuit having an input leg connected between a supply voltage node and a reference voltage node, the input leg comprising a current sink and a first resistor connected between an output of the current sink and the voltage supply node. The current sink has a minimum operating voltage required between the output of the current sink and the reference voltage node. Also in this example, the reference current circuit has an output leg connected between the supply voltage node and a load which receives the reference current output. The output leg includes a second resistor and a control transistor having a first current carrying terminal connected to the second resistor, a second current carrying terminal, and a gate. The load is connected in current flow communication with the second current carrying terminal of the control transistor. An amplifier, such as an operational amplifier, has a first input connected to the output node of the current sink in the input leg and a second input connected to a second node between the second resistor and the first current carrying terminal of the control transistor in the output leg. An output of the amplifier is connected to the gate of the control transistor. As a result, the amplifier drives the gate of the control transistor such that the voltage on the output node of the current sink matches the voltage on the second node of the output leg. This causes the current on the output leg to achieve value that causes the voltage drop across the second resistor in the output leg to match the voltage drop across the first resistor in the input leg. As a result, the current on the output leg is proportional to the current in the current sink of the input leg.

The values of the resistors can be set such that the output node of the current sink has a voltage VA, and a difference between a supply voltage applied to the supply voltage node and the voltage VA is less than a gate-to-source voltage VGS on a conducting diode-connected MOS transistor, which is typically about 0.6 V. Also, the difference can be less than 0.5 V.

The sizes of the first and second resistors can be chosen such that the voltage drop across the resistors is relatively small, including voltages in the millivolt range or less. In this way, the voltage VA can be maintained above the minimum operating voltage of the current sink even for low values of supply voltage.

Also, examples are described in which the load on the output leg of the reference current generator comprises a reference transistor in a current mirror. In this way, the reference current provided by the output leg of the reference current generator can be mirrored across a number of other circuits. In examples described herein, the reference current provided by the output leg of the reference current generator is mirrored across a plurality of output legs of the current mirror that are coupled to sense circuits in a memory device. Also, the current sink can produce a current that emulates current on a bit line or a memory cell in the memory device.

Other aspects and advantages of the present invention can be seen on review of the drawings, the detailed description and the claims, which follow.

DETAILED DESCRIPTION

Figure 1:
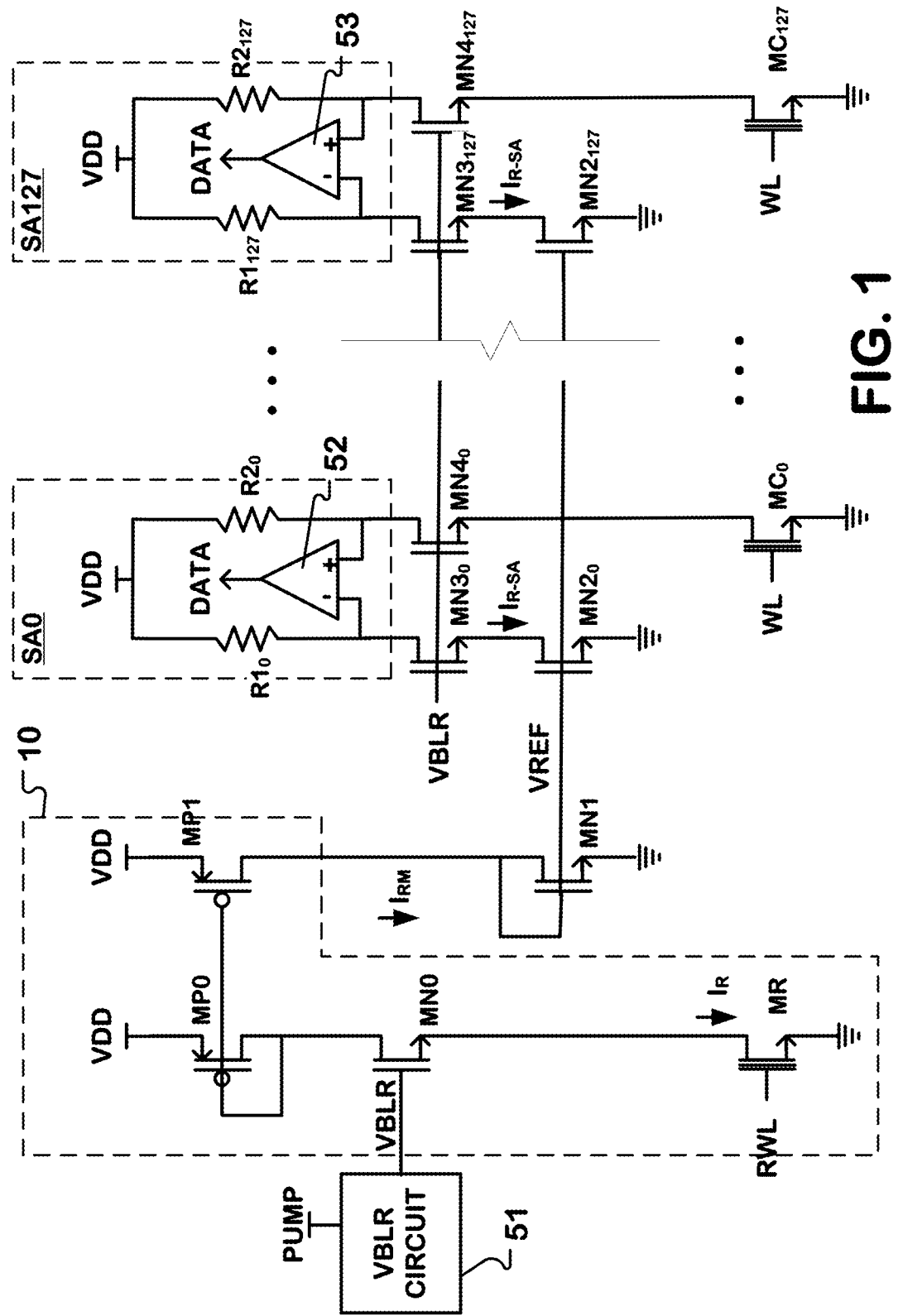
FIG. 1 is a schematic diagram of a memory device including a reference current generator typical of prior art devices.
Figure 2:
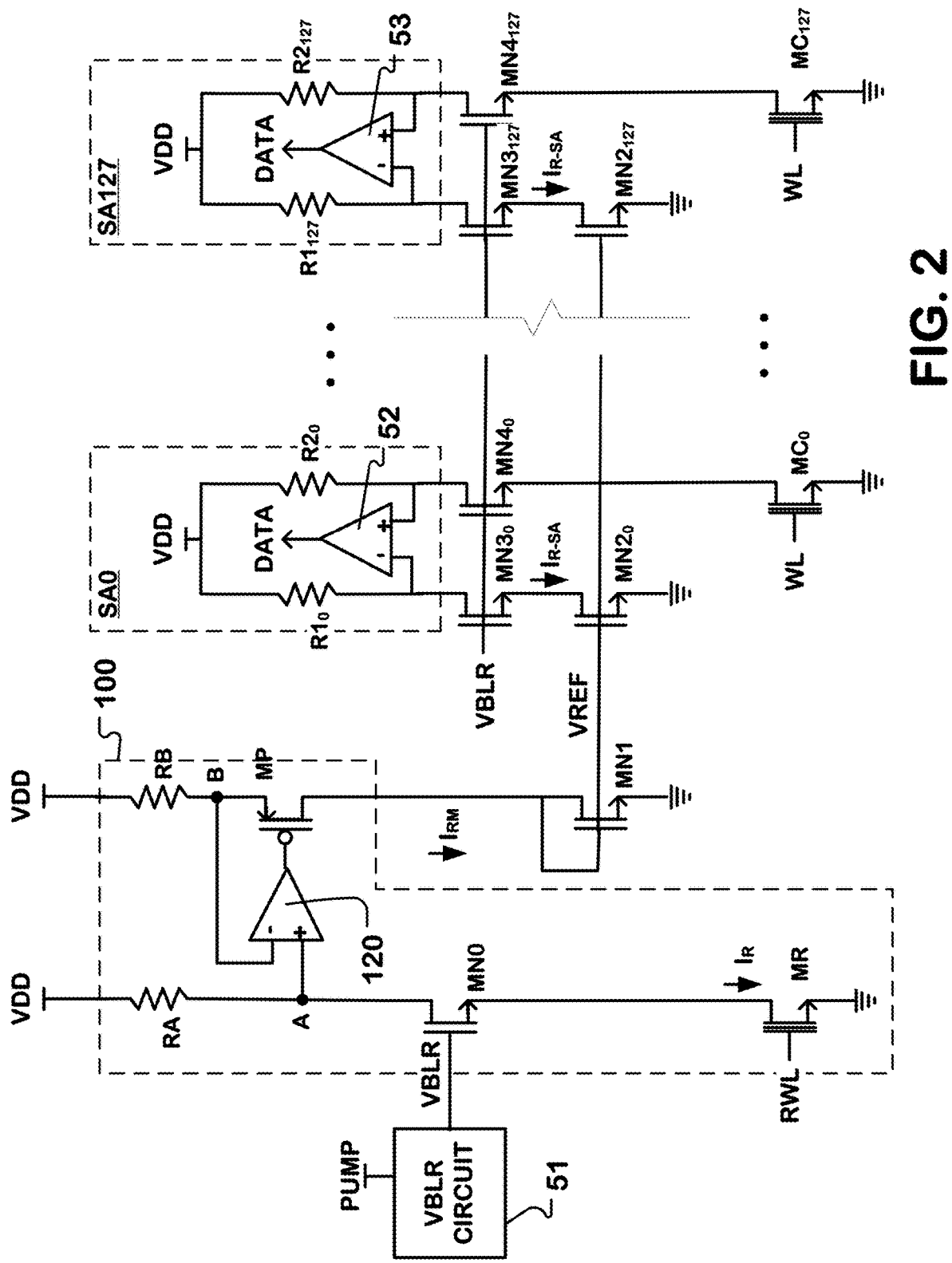
FIG. 2 is a schematic diagram of a memory device including an example of a low voltage reference current generator as described herein.
Figure 3:
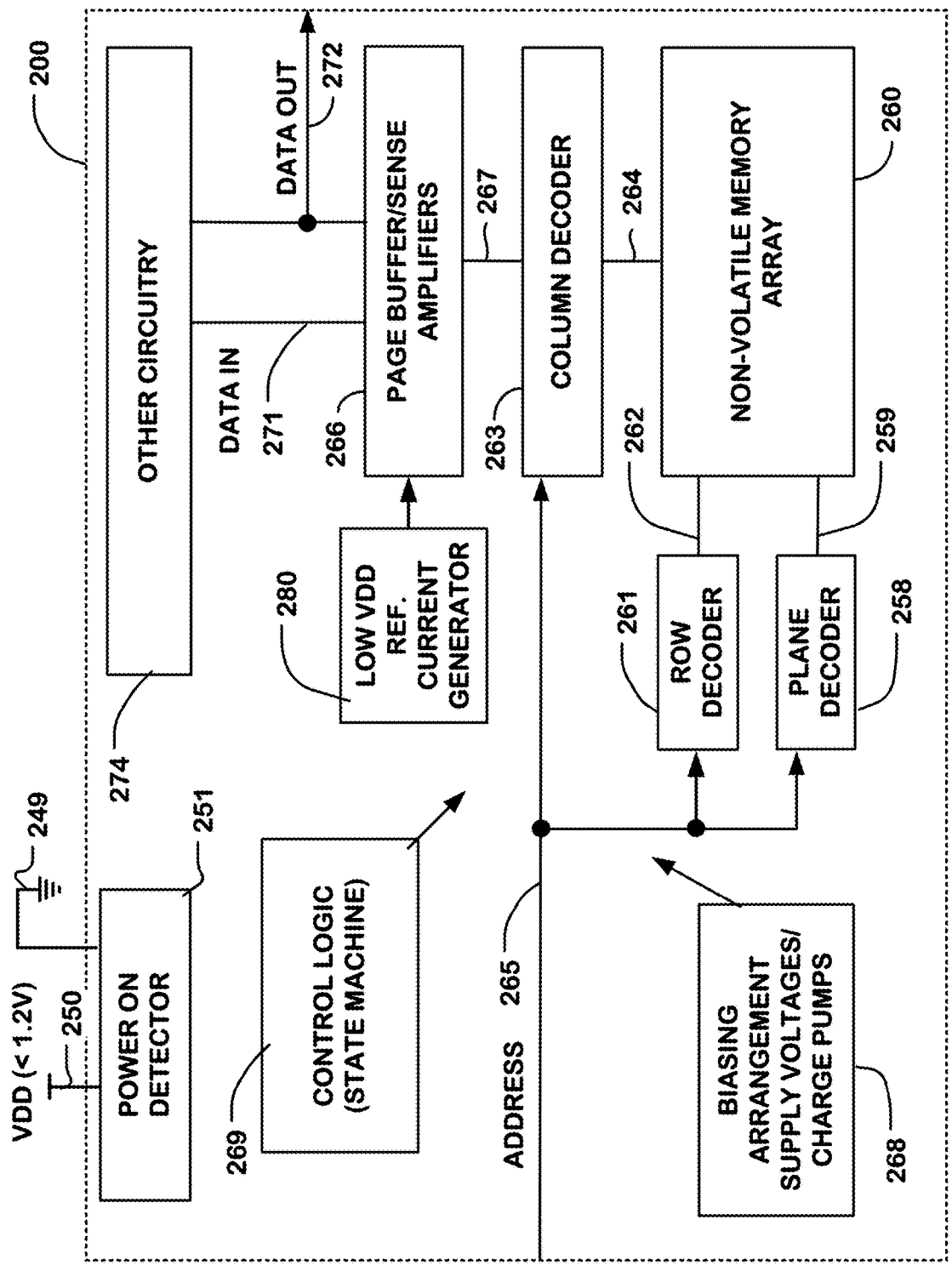
FIG. 3 is a simplified block diagram of an integrated circuit memory device that includes a low voltage reference current generator as described herein.

A detailed description of embodiments of the present invention is provided with reference to the FIGS. 1-3.

FIG. 1 is a schematic diagram of a memory device including a reference current generator typical of prior art devices. The diagram shows a reference current generator 10 coupled with a plurality of sense circuits, including sense amplifier SA0 to sense amplifier SA127. In this example, each of the sense amplifiers includes a comparator (e.g. 52, 53) having a first input connected to a reference current leg, and a second input connected to a bit line. Load resistors $R1_0$, $R1_{127}$ and $R2_0$, $R2_{127}$ are connected between the inputs and the supply voltage node at which supply voltage VDD is applied.

The bit line includes a regulating transistor $MN4_0$, $MN4_{127}$ (e.g., a bit line clamp transistor) and a selected memory cell $MC_0$, $MC_{127}$. The gate of the regulating transistor $MN4_0$, $MN4_{127}$ is connected to a bias voltage VBLR produced by a bias voltage generator circuit 51. This bias voltage VBLR can be close to or higher than the supply potential, using for example charge pumps (PUMP) to power the bias voltage generator circuit 51. The gate of the selected memory cell is connected to a word line WL. Decoding circuitry and the array structure of the memory cells are not described, as such structures can have a variety of arrangements as known in the art.

The reference current leg for the sense amplifiers includes a regulating transistor $MN3_0$, $MN3_{127}$ and an output leg transistor $MN2_0$, $MN2_{127}$ for a current mirror in which the input transistor MN1 is connected as a load for the reference current generator 10. The gate of the regulating transistor $MN3_0$, $MN3_{127}$ is connected to the bias voltage VBLR, in this example. In this way, the output current IRM of the reference current generator 10 is mirrored to provide reference current IR-SA for the plurality of sense amplifiers.

The reference current generator 10 in this example includes an input leg connected between a supply voltage node (receiving supply voltage VDD) and a reference node connected to a DC ground. In other embodiments, the reference node can be connected to AC ground or other DC voltage reference.

The input leg in this example comprises a diode-connected, p-channel MOS transistor MP0, and a current sink that comprises a transistor MN0 and a reference memory cell MR. MP0 has a source coupled to the supply voltage node VDD, and gate and drain connected in a diode configuration. The gate-to-source voltage VGS across MP0 will have a magnitude on the order of 0.6 V in typical circuitry. Transistor MP0 is a reference transistor for a current mirror, having an output transistor MP1 in the output leg of the reference current generator 10. A reference current $I_{RM}$ output from the output transistor MP1 of the current mirror is proportional to the current $I_R$ in the current sink, according to the relative sizes of transistors MP0 and MP1 in the typical current mirror configuration.

The gate of the transistor MN0 is connected to the bias voltage VBLR. The gate of the reference memory cell MR is connected to a reference word line RWL. The current sink thus emulates a bit line in the memory array, or alternatively emulates the memory cells in the memory array. Thus the current $I_R$ in the current sink can match current through the memory cells over a range of operating conditions.

However, the current sink has a minimum operating voltage which can be on the order of 0.8 V in some examples. Thus, the sum of the minimum operating voltage for the current sink and the voltage drop across MP0 can exceed the supply voltage VDD, as the supply voltage is reduced below 1.4 V.

As the supply voltage drops to 1.2 V and 1.0 V or less, the reference current generator 10 fails.

FIG. 2 is a schematic diagram of a memory device like that of FIG. 1, with a low voltage reference current generator overcoming the problems of that described with reference to FIG. 1. Components of FIG. 2 which are like those of FIG. 1 are given the same reference numerals or labels, and are not necessarily described again in the following discussion.

In this example, the reference current generator 100 produces an output reference current $I_{RM}$ based on current $I_R$ in a current sink that emulates a bit line like that of FIG. 1. However, the input and output legs of the reference current generator are substantially modified.

The input leg is connected between the supply voltage node and a reference voltage node, and includes a first resistor RA connected between the supply voltage node receiving VDD and node "A", at which the output of a current sink is attached. Node "A" is referred to as the output node of the current sink, and as a "first node". The current sink is a reference bit line circuit that comprises a transistor MN0 receiving the bias voltage VBLR at its gate, and a reference memory cell MR receiving a reference word line voltage RWL at its gate. A minimum operating voltage for the node "A" can be about 0.8 V in some embodiments of a reference bit line circuit like that of FIG. 2.

The output leg of the reference current generator 100 is connected between the supply voltage node and a load that comprises the reference transistor MN1 of a current mirror, producing a voltage VREF. The output leg includes a second resistor RB and a p-channel control transistor MP. The control transistor has a first current carrying node connected at node "B", which is also connected to the second resistor RB. The node "B" is also referred to as a "second node." The other terminal of the second resistor RB is connected to the supply voltage node. The control transistor MP has a second current carrying terminal at which the output reference current $I_{RM}$ is produced.

The reference current generator 100 includes an amplifier 120, which can be a high gain operational amplifier. A non-inverting input of the amplifier 120 is connected to the node "A" and an inverting input of the amplifier 120 is connected to the node "B". The output of the amplifier 120 is connected to the gate of the control transistor MP.

In operation, the current sink comprising the transistor MN0 and the reference memory cell MR produce a usable reference current IR when the voltage at node "A" exceeds the minimum operating voltage for the current sink, which is about 0.8 volts in a representative circuit. The resistor RA has a resistance that is set according to the headroom provided by the supply voltage. For example, with a supply voltage of 1.0 V, the resistor RA can be set so that the voltage drop from the supply voltage node to node "A" is about 200 mV, and in some examples 50 mV to 100 mV. In general, the voltage drop across the resistor RA can be less than the VGS of a diode connected MOS transistor like that used in the circuit of FIG. 1. Thus, for example, the voltage drop across the resistor RA can be on the order of 0.5 volts or less.

The output leg produces a reference current $I_{RM}$ that is proportional to the reference current $I_R$, where the proportionality depends on the relative values of the resistance of the resistor RA and the resistor RB. The proportionality can be expressed for some circuit implementations as a ratio of the inverse of the resistances RA and RB, such as ($1/RA \propto 1/RB$).

The amplifier 120 has an output connected to the gate of the control transistor MP, and operates to control the current $I_{RM}$ so that the voltage at node "B" is equal to the voltage at node "A".

Thus, the reference current generator 100 is capable of operating with a supply voltage on the order of 1.2 V or less, and in some examples on the order of 1 V or less.

The reference current generator 100 is described herein as a component of an integrated circuit memory device, in which the current sink comprises circuitry that emulates a bit line and includes a reference memory cell.

The use of the reference current generator 100 is particularly suited for integrated circuit memory devices designed for low supply voltage operation. The reference current generator 100 is also well suited for circuits in which the load on the output leg is a reference transistor (e.g. MN1) in a current mirror.

The reference current generator 100 can be also used in a wide variety of circuits, having different types of current sinks, and using the output reference current for different types of loads.

The example described here is based on the use of MOS transistors, and is configured for embodiments in which the supply voltage VDD is positive relative to the reference voltage (e.g. ground).

In other embodiments, the supply voltage can be negative relative to the reference voltage, and the types of transistors used can be changed from n-channel to p-channel, or vice versa as appropriate for the implementation.

Other embodiments can be implemented using bipolar junction transistors having the same general configuration.

FIG. 3 is a simplified block diagram of an integrated circuit memory device 200 that includes a low VDD reference current generator 280 like that discussed with reference to FIG. 2. In this example, the integrated circuit memory device 200 comprises a memory device including a non-volatile memory array 260 such as a 3D flash memory. Also other types of non-volatile and volatile memory technology can be used, including SRAM, DRAM, phase change memory, cross-point memory, metal oxide memory and others.

In other embodiments, the integrated circuit memory device 200 can comprise any type of circuit that may not include a memory array, but that utilizes a reference current generator, including a microprocessor, a graphics processor unit, an application-specific integrated circuit, the field programmable gate array, analog devices such as a radio receiver or transmitter, or other types of digital, analog and mixed signal integrated circuits.

In this example, the memory array 260 is coupled to the peripheral circuits including a row decoder 261 which is coupled by lines 262 to the memory array 260, a plane decoder 258 which is coupled by lines 259 to the memory array 260, and a column decoder 263 which is coupled to bit lines 264 of the memory array. Addresses are provided on line 265, which may include an address generator (not shown), for example. Sense amplifiers and data-in structures (block 266) provide data input and output paths through the column decoder 263 and bit lines 267 to the memory array. Output data is provided on line 272 for delivery off chip. Input data 271 in this example comes from other circuitry 274 on the circuit, which can include input circuits, processors, or other types of circuitry.

Control logic 269 including a state machine is provided to generate control and timing signals necessary for operation of the memory. Biasing arrangement supply voltages and charge pumps are included in block 268, which produce a variety of voltages required during memory operations, applied under the control of the control logic 269.

In this embodiment, low VDD reference current generator 280, implemented as described above with reference to FIG. 2, is coupled to the page buffer/sense amplifier block 266. In some embodiments, the sense amplifier block can include a plurality of sense circuits as described above. In other embodiments, other types of sense circuits can be utilized. Also, the reference current generator 280 can supply reference current to other components of the device 200.

The integrated circuit memory device 200 has an external supply node 250 coupled to a voltage VDD less than 1.2 V, which can be about 1 V or less in some implementations. Also, the integrated circuit memory device 200 has an external reference node 249 coupled to a DC ground. In other embodiments, the reference node can be connected to AC ground or other DC voltage reference. A power-on detector circuit 251 is provided on the integrated circuit to detect a power-on event, and to generate a signal that is supplied to the state machine in the control logic 269, and to other circuitry on the chip.

A reference current generator has been described that is operable with an integrated circuit memory, using a current sink that emulates a bit line in the memory. The minimum operating voltage of a current sink of this type can approach 0.8 V or more. Thus, the headroom available between the supply voltage and the minimum operating voltage of the current sink is less than a minimum operating voltage of a reference transistor in a current mirror. This problem that arises in low supply voltage circuitry is overcome as described herein using a reference current generator based on resistors and an operational amplifier. In this way, the circuitry is able to operate with a headroom of 0.2 V or less, including in some examples 50 mV to 100 mV, above the minimum operating voltage of the current sink.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

The invention claimed is:

1. A reference current circuit, comprising:
an input leg connected between a supply voltage node and a reference voltage node, including a current sink having an output node and a first resistor connected between the output node and the supply voltage node;
an output leg connected between the supply voltage node and a load, the output leg including a second resistor, a control transistor having a first current carrying terminal connected to the second resistor, and a second current carrying terminal, and a gate; and
an amplifier having a first input connected to the output node of the current sink in the input leg and a second input connected to a second node between the second resistor and the first current carrying terminal of the control transistor in the output leg, and an output connected to the gate of the control transistor in the output leg.

2. The circuit of claim 1, wherein the output node of the current sink has a voltage VA, and a difference between a supply voltage applied to the supply node and the voltage VA is less than a gate-to-source voltage VGS on a conducting diode-connected MOS transistor.

3. The circuit of claim 1, wherein the resistance of the first resistor is such that a voltage drop across the first resistor is less than 0.5 V.

4. The circuit of claim 1, wherein the resistance of the first resistor is such that a voltage drop across the first resistor is in a range from 50 mV to 100 mV.

5. The circuit of claim 1, including a current mirror, and wherein the load on the output leg comprises a reference transistor in the current mirror.

6. The circuit of claim 1, wherein the current sink on the input leg comprises a reference bit line circuit.

7. The circuit of claim 1, wherein the current sink on the input leg comprises a reference cell for a memory;
further including a current mirror; and wherein:
the load on the output leg comprises a reference transistor in the current mirror having output transistors coupled to sensing circuits for memory cells in the memory.

8. The circuit of claim 1, wherein the control transistor in the output leg comprises a p-type transistor.

9. The circuit of claim 1, wherein the amplifier comprises an operational amplifier.

10. A memory device, comprising:
a plurality of memory cells coupled to bit lines;
a plurality of sense amplifiers coupled to the bit lines;
bit line regulating transistors on the bit lines, between the sense amplifiers and the memory cells; and
a reference current generator, the reference current generator comprising:
  an input leg connected between a supply voltage node and a reference voltage node, including a current sink having an output node and a first resistor connected between the output node and the supply voltage node, the current sink including a reference bit line circuit and a reference memory cell;
  an output leg connected between the supply voltage node and a load, the output leg including a second resistor, and a control transistor having a first current carrying terminal connected to the second resistor, and a second current carrying terminal, and a gate;
  the load comprising a reference leg of a current mirror; and
  an amplifier having a first input connected to the output node of the current sink in the input leg and a second input connected to a second node in the output leg between the second resistor and the first current carrying terminal of the control transistor, and an output connected to the gate of the transistor in the second leg; and
  wherein the current mirror includes a plurality of output legs, and sense amplifiers in the plurality of sense amplifiers include respective output legs of the plurality of output legs in the current mirror.

11. The device of claim 10, wherein the output node of the current sink has a voltage VA, and a difference between a supply voltage applied to the supply node and the voltage VA is less than a gate-to-source voltage VGS on a conducting diode-connected MOS transistor.

12. The device of claim 10, wherein the resistance of the first resistor is such that a voltage drop across the first resistor is less than 0.5 V.

13. The device of claim 10, wherein the resistance of the first resistor is such that a voltage drop across the first resistor is in a range from 50 mV to 100 mV.

14. The device of claim 10, wherein the control transistor in the output leg comprises a p-type transistor.

15. The device of claim 10, wherein a supply voltage applied to the supply node is less than 1.2 V.

16. The device of claim 10, wherein the memory cells comprise non-volatile memory cells.

* * * * *